(12) United States Patent
Chen (10) Patent No.: US 11,266,021 B2
(45) Date of Patent: Mar. 1, 2022

(54) FLEXIBLE DISPLAY PANEL (71) Applicant: WUHAN CHINA STAR OPTOELECTRONICS SEMICONDUCTOR DISPLAY TECHNOLOGY CO., LTD., Hubei (CN)

(72) Inventor: Huipeng Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 194 days.

(21) Appl. No.: 16/638,768

(22) PCT Filed: Jan. 8, 2020

(86) PCT No.: PCT/CN2020/070808
§ 371 (c)(1),
(2) Date: Feb. 13, 2020

(87) PCT Pub. No.: WO2021/036163
PCT Pub. Date: Mar. 4, 2021

(65) Prior Publication Data
US 2021/0068254 A1 Mar. 4, 2021

(30) Foreign Application Priority Data
Aug. 27, 2019 (CN) .......................... 201910797933.0

(51) Int. Cl.
H05K 7/00 (2006.01)
H05K 1/00 (2006.01)
(Continued)

(52) U.S. Cl.
CPC ......... *H05K 1/147* (2013.01); *H01L 51/0097* (2013.01); *H05K 1/118* (2013.01);
(Continued)

(58) Field of Classification Search
CPC .... H05K 1/147; H05K 1/118; H01L 51/0097; H01L 2251/5338
(Continued)

(56) References Cited

U.S. PATENT DOCUMENTS

2010/0220455 A1 9/2010 Hsu et al.
2016/0179229 A1* 6/2016 Ahn ..................... H01L 27/3262
345/173
(Continued)

FOREIGN PATENT DOCUMENTS

CN 105513499 A 4/2016
CN 105551378 A 5/2016
(Continued)

*Primary Examiner* — Andargie M Aychillhum
(74) *Attorney, Agent, or Firm* — Mark M. Friedman (57) ABSTRACT

The present application provides a flexible display panel including a flexible substrate and a flexible circuit board electrically connected to the flexible substrate. Pins on the flexible substrate and the flexible circuit board are disposed to be inclined at a certain angle. When pitches of the pins on the flexible circuit board are changed due to expansion and contraction of the flexible circuit board itself, an accurate alignment of the pins on the flexible substrate and the flexible circuit board can be realized by adjusting the position of the flexible circuit board relative to the flexible substrate before connecting the flexible circuit board to the flexible substrate, thereby ensuring the quality of the flexible display panel and improving product yield of the display panel.

19 Claims, 7 Drawing Sheets (51) Int. Cl.
  *H05K 1/14* (2006.01)
  *H01L 51/00* (2006.01)
  *H05K 1/11* (2006.01)

(52) U.S. Cl.
  CPC ............... *H01L 2251/5338* (2013.01); *H05K 2201/10128* (2013.01)

(58) Field of Classification Search
  USPC ........................................................ 361/749
  See application file for complete search history.

(56) References Cited

U.S. PATENT DOCUMENTS

| | | |
|---|---|---|
| 2018/0090442 A1 | 3/2018 | Li et al. |
| 2018/0108636 A1 | 4/2018 | Chen et al. |
| 2018/0122758 A1 | 5/2018 | Chen et al. |
| 2020/0098675 A1 | 3/2020 | Chang et al. |
| 2020/0300906 A1* | 9/2020 | Zhang .................. G02F 1/1309 |

FOREIGN PATENT DOCUMENTS

| | | |
|---|---|---|
| CN | 105609007 A | 5/2016 |
| CN | 106783880 A | 5/2017 |
| CN | 109064905 A | 12/2018 |
| CN | 109860248 A | 6/2019 |
| TW | 200827885 A | 7/2008 |

* cited by examiner

FLEXIBLE DISPLAY PANEL

FIELD OF THE DISCLOSURE

The present application relates to display technologies, and more particularly to a flexible display panel.

DESCRIPTION OF RELATED ARTS

In recent years, with the development of display panel manufacturing technologies, flexible display has become a key word in the field of display panel manufacture. More and more panel manufacturers and research institutions have listed flexible display technologies as a research priority. Flexible display panels are expected to have a wide range of applications in display terminals such as mobile phones and tablet computers due to their characteristics of lightness, thinness, bendability, and beauty.

Technical Problems

When a flexible substrate is bound and connected to a flexible circuit board in an existing flexible display panel, output pins on the flexible circuit board are aligned with and connected to input pins on the flexible substrate via a conductive film. However, since the flexible circuit board is made of a material with a large expansion coefficient, such as polyimide, and the flexible circuit board is relatively thin in thickness and thus is susceptible to the external environment to be deformed by expansion or contraction, this leads the flexible circuit board unable to align with the pins on the flexible substrate accurately. In severe circumstances, the pins of the flexible substrate and the pins of the flexible circuit board may be connected and misaligned with each other, causing problems such as short circuits. The product yield of the flexible display panel is seriously affected.

Technical Solutions

To solve above problems, the technical solutions provide in the present application are described below.

The present application provides a flexible display panel, including:

a flexible substrate, including a display region and a non-display region located at an external side of the display region, a first pin set disposed in the non-display region, the first pin set including a plurality of first pins disposed side by side along a first direction; and a flexible circuit board, including a second pin set including a plurality of second pins disposed side by side along the first direction, wherein the first pins and the second pins are electrically connected to each other, wherein the first direction is perpendicular to a second direction, both of a first central axis of the first pin set and a second central axis of the second pin set are parallel to the second direction, at least a part of the first pins are inclined toward the first central axis and at least a part of the second pins are inclined toward the second central axis.

In the flexible display panel of the present application, the first pins are inclined toward the first central axis and the second pins are inclined toward the second central axis, and the first pins and the second pins are connected in one-to-one correspondence.

In the flexible display panel of the present application, the first pins are symmetric with respect to the first central axis, imaginary extending lines of the first pins at a left side of the first central axis and the imaginary extending lines of the first pins at a right side of the first central axis intersect at the first central axis two by two.

In the flexible display panel of the present application, the second pins are symmetric with respect to the second central axis, the imaginary extending lines of the second pins at the left side of the second central axis and the imaginary extending lines of the second pins at the right side of the second central axis intersect at the second central axis two by two.

In the flexible display panel of the present application, inclined angles of the first pins toward the first central axis are same and the inclined angles of the second pins toward the second central axis are same.

In the flexible display panel of the present application, the inclined angles of the first pins toward the first central axis are as the same as the inclined angles of the second pins toward the second central axis.

In the flexible display panel of the present application, inclined angles of the first pins located away from the first central axis and inclined toward the first central axis are greater than the inclined angles of the first pins located close to the first central axis and inclined toward the first central axis.

In the flexible display panel of the present application, inclined angles of the second pins located away from the second central axis and inclined toward the second central axis are greater than the inclined angles of the second pins located close to the second central axis and inclined toward the second central axis.

In the flexible display panel of the present application, intersections of the first pins and the first central axis are close to the display region.

In the flexible display panel of the present application, the intersections of the second pins and the second central axis are close to the display region.

In the flexible display panel of the present application, intersections of the first pins and the first central axis are away from the display region.

In the flexible display panel of the present application, the intersections of the second pins and the second central axis are away from the display region.

In the flexible display panel of the present application, the first pins located close to the first central axis are disposed parallel to the first central axis.

In the flexible display panel of the present application, a number of the first pins disposed parallel to the first central axis is no less than one.

In the flexible display panel of the present application, the second pins located close to the second central axis are disposed parallel to the second central axis.

In the flexible display panel of the present application, a number of the second pins disposed parallel to the second central axis is no less than one.

In the flexible display panel of the present application, the first pins and the second pins are connected to each other via a conductive film.

In the flexible display panel of the present application, the flexible circuit board includes an integrated chip electrically connected to the second pins, and the integrated chip is configured to send control signals to the second pins.

In the flexible display panel of the present application, the first pins and the second pins are shaped as parallelograms or trapezoids.

Beneficial Effects

The flexible display panel provided in the present application includes a flexible substrate and a flexible circuit board. Pins on the flexible substrate and the flexible circuit board are disposed to be inclined at a certain angle. When pitches of the pins on the flexible circuit board are changed due to expansion and contraction of the flexible circuit board itself, an accurate alignment of the pins on the flexible substrate and the flexible circuit board can be realized by adjusting the position of the flexible circuit board relative to the flexible substrate before connecting the flexible circuit board to the flexible substrate, thereby ensuring the quality of the flexible display panel and improving product yield in manufacturing processes of the display panel.

DESCRIPTION OF DRAWINGS

FIG. 3 is a structural schematic diagram showing a flexible circuit board provided in an embodiment of the present application, wherein the intersections of second pins 24 and a second central axis 23s are close to a first end 20a.

DESCRIPTION OF EMBODIMENTS OF THE DISCLOSURE

The following descriptions for the respective embodiments are specific embodiments capable of being implemented for illustrations of the present application with referring to the appended figures. In describing the present application, spatially relative terms such as "upper", "lower", "front", "back", "left", "right", "inner", "outer", "lateral", and the like, may be used herein for ease of description as illustrated in the figures. Therefore, the spatially relative terms used herein are intended to illustrate the present application for ease of understanding, but are not intended to limit the present application. In the appended figures, units with similar structures are indicated by same reference numbers.

Embodiments of the present application provide a flexible display panel including a flexible substrate and a flexible circuit board, where the flexible substrate and the flexible circuit board are electrically connected to each other via respective circuit pins. To solve the problem of misalignment of the pins, caused by deformation of the flexible circuit board when connecting the flexible circuit board to the flexible substrate, the embodiments of the present application provide a solution—pins on the flexible substrate and the flexible circuit board are disposed to be inclined at a certain angle. When the flexible circuit board is deformed, a correct alignment of the pins on the flexible substrate and the flexible circuit board can be realized by adjusting the position of the flexible circuit board relative to the flexible substrate, thereby ensuring the quality of the flexible display panel and improving product yield.

Figure 1:
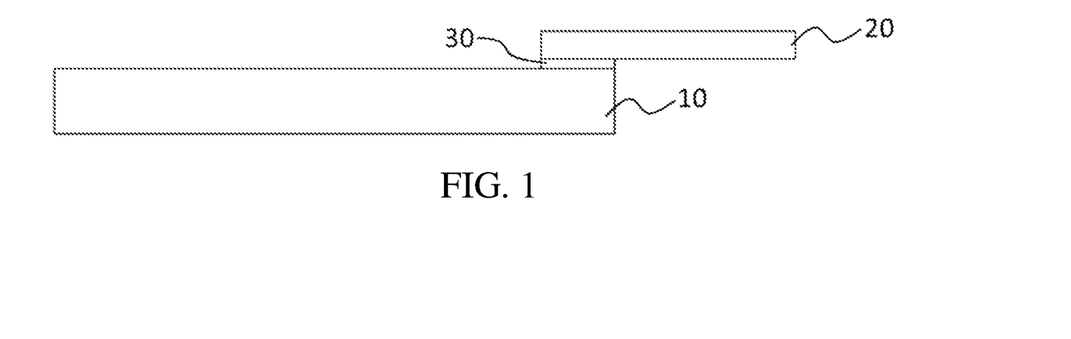
FIG. 1 is a structural schematic diagram showing a flexible display panel provided in an embodiment of the present application.

FIG. 1 is a structural schematic diagram showing a flexible display panel provided in an embodiment of the present application. The flexible display panel includes a flexible substrate 10 and a flexible circuit board 20. The flexible substrate 10 has an image display function. The flexible circuit board 20 provides electrical signals (e.g., data signals, scan signals and etc.) to the flexible substrate 10 for controlling the image display function of the flexible substrate 10.

Optionally, an electrical connection is kept between the flexible substrate 10 and the flexible circuit board 20 by conductive adhesive 30. The conductive adhesive 30 may be anisotropy conductive adhesive.

Optionally, the flexible display panel may be an organic light-emitting diode (OLED) display panel.

Figure 2:
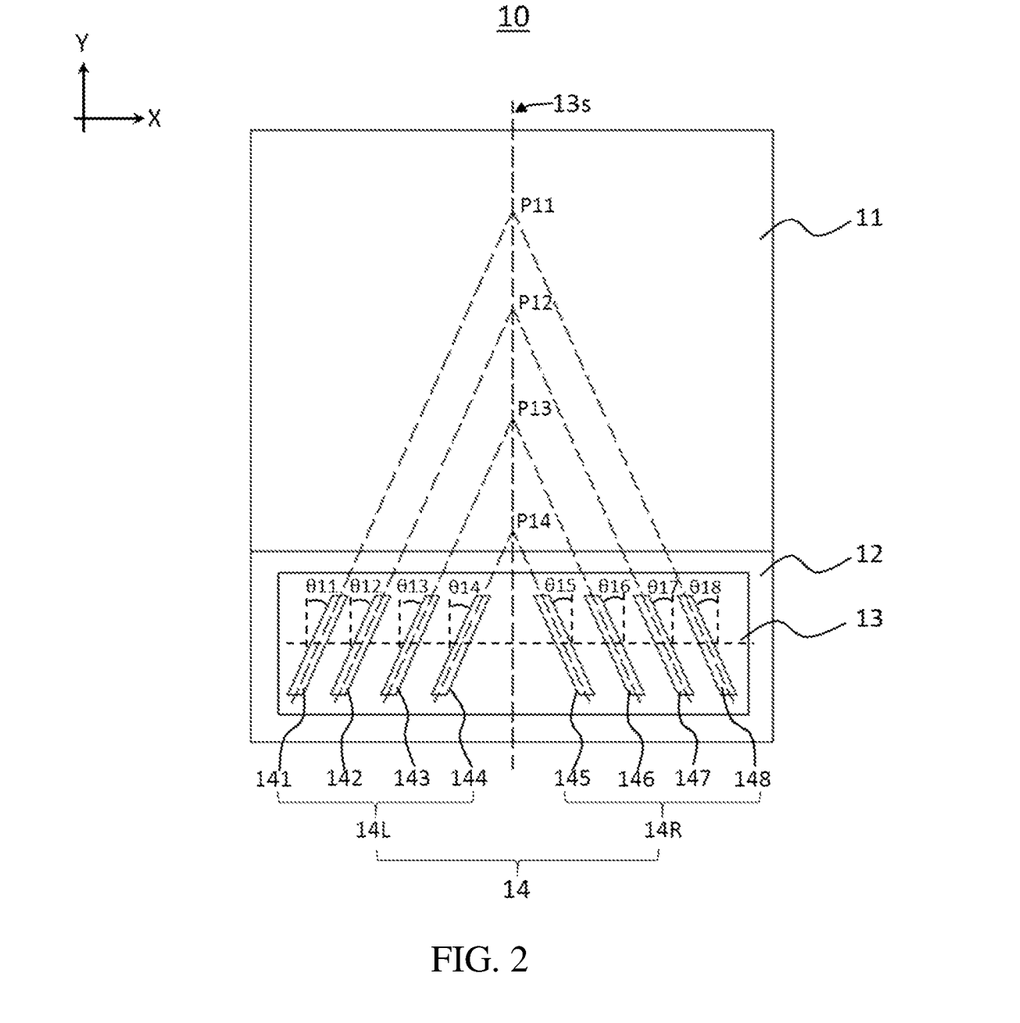
FIG. 2 is a structural schematic diagram showing a flexible substrate provided in an embodiment of the present application, wherein the intersections of first pins 14 and a first central axis 13s are close to a display region 11.

FIG. 2 is a structural schematic diagram showing a flexible substrate 10 provided in an embodiment of the present application. The flexible substrate 10 includes a display region 11 and a non-display region 12. The flexible substrate 10 displays images using the display region 11. Accordingly, the display region 11 may include red, green and blue pixels. The non-display region 12 is disposed at an external side of the display region 11. Optionally, the non-display region 12 is disposed at an edge at a side of the flexible substrate 10 and the display region 11 is disposed on the flexible substrate 10 at another side of the flexible substrate 10 opposite to the non-display region 12. In addition, optionally, the display region 11 may be disposed in a central area of the flexible substrate 10, and the non-display region 12 is disposed in a peripheral area of the flexible substrate 10 and the non-display region 12 encompasses the display region 11. It is noted that the position relation between the display region 11 and the non-display region 12 is not limited in the present application.

A first pin set 13 is disposed in the non-display region 12. The first pin set 13 includes a plurality of first pins 14 disposed side by side along a first direction X. Optionally, the first pins 14 may be an input end of the flexible substrate 10 for inputting electrical signals. Various conductive lines electrically connected to the first pins 14 may be further included in the non-display region 12 and are configured to transmit various electrical signals received by the first pins 14 to the inside of the flexible substrate 10 for controlling a display function of the flexible substrate 10. For instance, a part of the first pins 14 are connected to scan lines of the flexible substrate 10. When the first pins receive scan signals, the scan lines transmit the scan signals to scan units to accomplish scan processes.

It is noted that the first direction X described in the embodiments of the present application is a horizontal direction toward the right as indicated in FIG. 2. Meanwhile, a second direction Y defined in the present application is perpendicular to the first direction X and is a vertical upward direction as indicated in FIG. 2.

A first central axis 13s of the first pin set 13 is parallel to the second direction Y. At least a part of the first pins 14 are inclined toward the first central axis 13s. It is noted that the first central axis 13s can be understood as a vertical symmetric axis of the first pin set 13 along the second direction Y. That is, a part of the first pin set 13 located at the left side of the first central axis 13s are symmetric to a part of the first pin set 13 located at the right side of the first central axis 13s with respect to the first central axis 13s. The first pins 14 inclined toward the first central axis 13s can be understood as follows: the distance from one end of the first pin 14 to the first central axis 13s is less than the distance from the other end of the first pin 14 to the first central axis 13s and an imaginary extending line of the first pin 14 extending along its lengthwise direction intersects with the first central axis 13s.

Optionally, the first pins 14 include a left pin area 14L located at the left side of the first central axis 13s and a right pin area 14R located at the right side of the first central axis 13s. The first pins 14 in the left pin area 14L are symmetric to the first pins 14 in the right pin area 14R with respect to the first central axis 13s. The imaginary extending lines of the first pins 14 in the left pin area 14L and the imaginary extending lines of the first pins 14 in the right pin area 14R intersect at the first central axis 13s two by two. For example, as shown in FIG. 2, a pin 141, a pin 142, a pin 143 and a pin 144 are included in the left pin area 14L and a pin 145, a pin 146, a pin 147 and a pin 148 are included in the right pin area 14R. The imaginary extending line of the pin 141 and the imaginary extending line of the pin 148 intersect at a point P11 on the first central axis 13s; the imaginary extending line of the pin 142 and the imaginary extending line of the pin 147 intersect at a point P12 on the first central axis 13s; the imaginary extending line of the pin 143 and the imaginary extending line of the pin 146 intersect at a point P13 on the first central axis 13s; the imaginary extending line of the pin 144 and the imaginary extending line of the pin 145 intersect at a point P14 on the first central axis 13s.

Optionally, inclined angles of the first pins 14 inclined toward the first central axis 13s are same. For instance, as shown in FIG. 2, the inclined angles of the pin 141, the pin 142, the pin 143, the pin 144, the pin 145, the pin 146, the pin 147 and the pin 148 inclined toward the first central axis 13s are $\theta 11$, $\theta 12$, $\theta 13$, $\theta 14$, $\theta 15$, $\theta 16$, $\theta 17$ and $\theta 18$, respectively, where $\theta 11=\theta 12=\theta 13=\theta 14=\theta 15=\theta 16=\theta 17=\theta 18$. It should be understood that arranging the inclined angles of the first pins 14 inclined toward the first central axis 13s to be same may simplify manufacturing processes of the first pins 14. Accordingly, for such an arrangement of the first pins 14, a single mask may use with a single-step deposition when manufacturing the first pins 14 by deposition.

Optionally, the inclined angles of the first pins 14 located away from the first central axis 13s and inclined toward the first central axis 13s are greater than the inclined angles of the first pins 14 located close to the first central axis 13s and inclined toward the first central axis 13s. For instance, as shown in FIG. 2, the inclined angles of the pin 141, the pin 142, the pin 143, the pin 144, the pin 145, the pin 146, the pin 147 and the pin 148 inclined toward the first central axis 13s are $\theta 11$, $\theta 12$, $\theta 13$, $\theta 14$, $\theta 15$, $\theta 16$, $\theta 17$ and $\theta 18$, respectively, where $\theta 11>\theta 12>\theta 13>\theta 14$ and $\theta 18>\theta 17>\theta 16>\theta 15$. In addition, optionally, $\theta 11=\theta 18$, $\theta 12=\theta 17$, $\theta 13=\theta 16$ and $\theta 14=\theta 15$. The developing basis of the present embodiment is that substrate deformation causes a relatively large impact on the pins close to the outside and thus, it is easier to realize an alignment of the flexible substrate with the flexible circuit board by increasing the inclined angles of the pins close to the outside.

Figure 6:
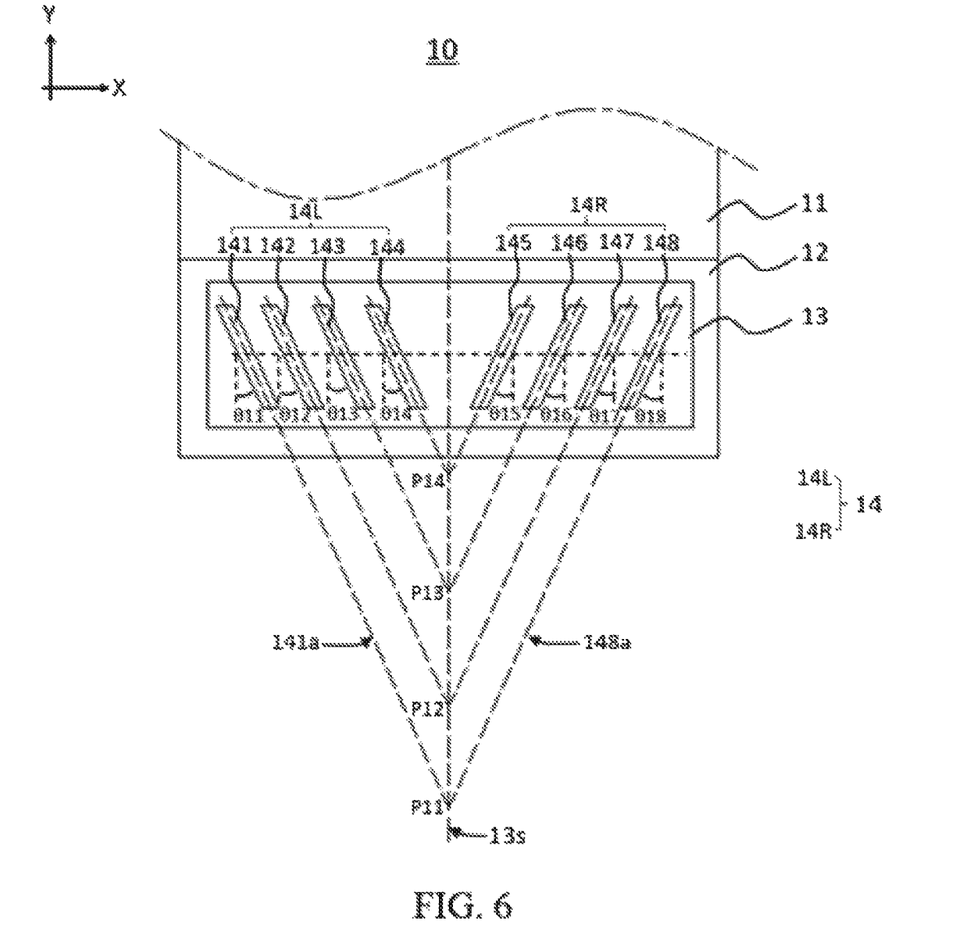
FIG. 6 is a structural schematic diagram showing a flexible substrate provided in an embodiment of the present application, wherein the intersections of first pins 14 and a first central axis 13s are away from a display region 11.

Optionally, the intersections of the first pins 14 and the first central axis 13s may be close to the display region 11 (as shown in FIG. 2) or may also be away from the display region 11 (as shown in FIG. 6). It is noted that "the intersections of the first pins 14 and the first central axis 13s are close to the display region 11" described in the present application means that the first pins 14 intersect with the first central axis 13s only when extending along a direction toward the display region 11, and conversely they do not intersect with each other. It is also noted that "the intersections of the first pins 14 and the first central axis 13s are away from the display region 11" means that the first pins 14 intersect with the first central axis 13s only when extending along a direction away from the display region 11, and conversely they do not intersect with each other. The embodiments of the present application provide two types of deployment of the first pins 14 as shown in FIGS. 2 and 6. It should be understood that the two types of deployment can achieve a same effect and can be chosen freely based on the structure and manufacturing processes of the display panel in practical applications.

Figure 4:
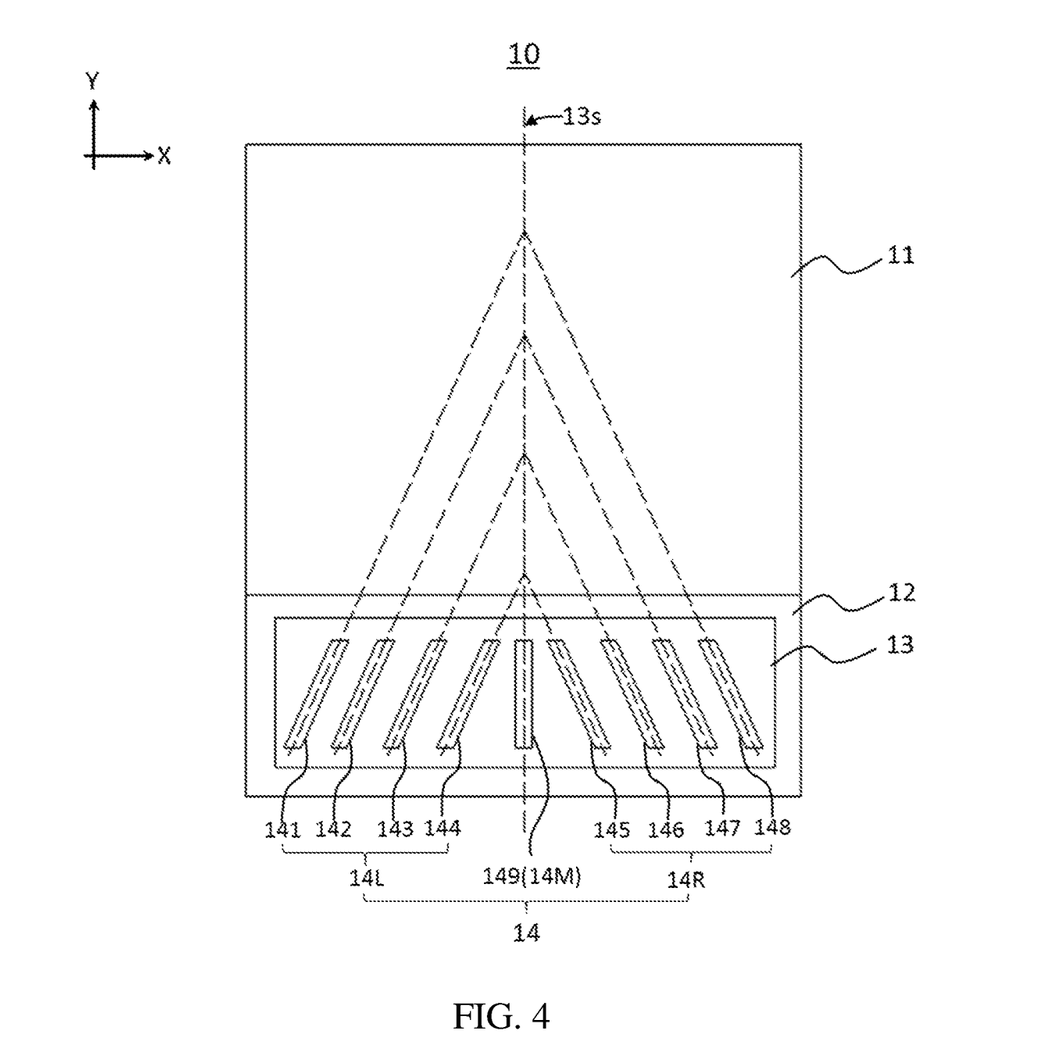
FIG. 4 is a structural schematic diagram showing a flexible substrate provided in an embodiment of the present application, wherein a difference between the flexible substrates shown in FIGS. 2 and 4 is that the flexible substrate shown in FIG. 4 includes a central pin area 14M.

Optionally, as shown in FIG. 4, the first pins 14 further include a central pin area 14M near the first central axis 13s. The pins in the central pin area 14M are parallel to the first central axis 13s. As shown in FIG. 4, the central pin area 14M includes a pin 149 which is parallel to the first central axis 13s. It is noted that the central pin area 14M may include one or more first pins 14, and the number of the first pins 14 included in the central pin area 14M is not limited in the present application. The developing basis of the present embodiment is that substrate deformation causes a relatively small impact on the pins at middle positions and thus, it can be ensured an accurate alignment of the flexible substrate with the flexible circuit board even though the pins at the middle positions are disposed to be parallel to the central axis.

It is noted that the flexible display panel provided in the embodiments of the present application includes the flexible substrate 10 and the flexible circuit board 20 that are connected to each other, as shown in FIG. 1, in which the pins of the flexible substrate 10 and the pins of the flexible circuit board 20 are connected to each other in one-to-one correspondence. Accordingly, in an aspect of deployment, a one-to-one relation exists between the pins of the flexible circuit board 20 and the pins of the flexible substrate 10. The flexible circuit board 20 corresponding to the flexible substrate 10 provided in above embodiments will be described as follows.

Figure 3:
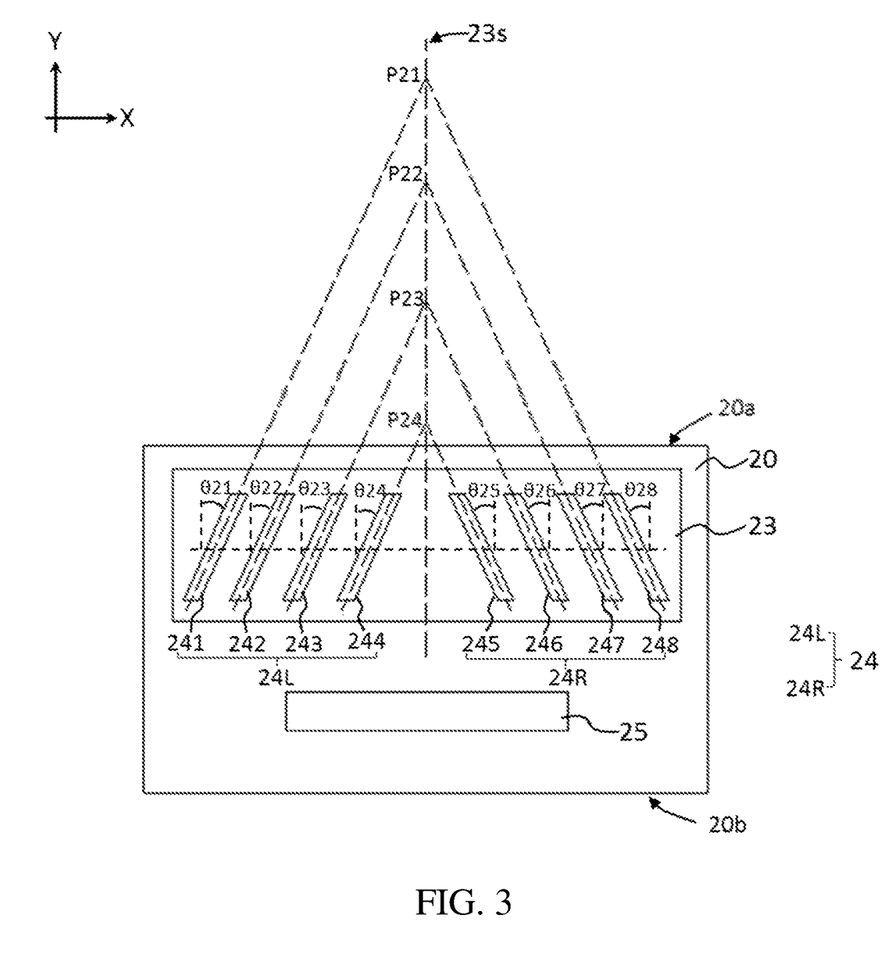

FIG. 3 is a structural schematic diagram showing a flexible circuit board 20 provided in an embodiment of the present application. The flexible circuit board 20 includes a second pin set 23 including a plurality of second pins 24 disposed side by side along the first direction X. Optionally, the second pins 24 may be an output end of the flexible circuit board 20 for outputting electrical signals. Various conductive lines electrically connected to the second pins 24 may be further included in the flexible circuit board 20 and are configured to transmit the electrical signals to the second pins 14. Optionally, the flexible circuit board 20 further includes an integrated chip 25 electrically connected to the second pins for sending control signals to the second pins 24.

A second central axis 23s of the second pin set 23 is parallel to the second direction Y. At least a part of the second pins 24 are inclined toward the second central axis 23s. It is noted that the second central axis 23s can be understood as a vertical symmetric axis of the second pin set 23 along the second direction Y. That is, a part of the second pin set 23 located at the left side of the second central axis 23s are symmetric to a part of the second pin set 23 located at the right side of the second central axis 23s with respect to the second central axis 23s. The second pins 24 inclined toward the second central axis 23s can be understood as follows: the distance from one end of the second pin 24 to the second central axis 23s is less than the distance from the other end of the second pin 24 to the second central axis 23s and an imaginary extending line of the second pin 24 extending along its lengthwise direction intersects with the second central axis 23s.

Optionally, the second pins 24 include a left pin area 24L located at the left side of the second central axis 23s and a right pin area 24R located at the right side of the second central axis 23s. The second pins 24 in the left pin area 24L are symmetric to the second pins 24 in the right pin area 24R with respect to the second central axis s3s. The imaginary extending lines of the second pins 24 in the left pin area 24L and the imaginary extending lines of the second pins 24 in the right pin area 24R intersect at the second central axis 23s two by two. For example, as shown in FIG. 3, a pin 241, a pin 242, a pin 243 and a pin 244 are included in the left pin area 24L and a pin 245, a pin 246, a pin 247 and a pin 248 are included in the right pin area 24R. The imaginary extending line of the pin 241 and the imaginary extending line of the pin 248 intersect at a point P21 on the second central axis 23s; the imaginary extending line of the pin 242 and the imaginary extending line of the pin 247 intersect at a point P22 on the second central axis 23s; the imaginary extending line of the pin 243 and the imaginary extending line of the pin 246 intersect at a point P23 on the second central axis 23s; the imaginary extending line of the pin 244 and the imaginary extending line of the pin 245 intersect at a point P24 on the second central axis 23s.

Optionally, inclined angles of the second pins 24 inclined toward the second central axis 23s are same. For instance, as shown in FIG. 3, the inclined angles of the pin 241, the pin 242, the pin 243, the pin 244, the pin 245, the pin 246, the pin 247 and the pin 248 inclined toward the second central axis 23s are $\theta21$, $\theta22$, $\theta23$, $\theta24$, $\theta25$, $\theta26$, $\theta27$ and $\theta28$, respectively, where $\theta22=\theta23=\theta24=\theta25=\theta26=\theta27=\theta28$. It should be understood that arranging the inclined angles of the second pins 24 inclined toward the second central axis 23s to be same may simplify manufacturing processes of the second pins 24. Accordingly, for such an arrangement of the second pins 24, a single mask may use with a single-step deposition when manufacturing the second pins 24 by deposition.

Optionally, the inclined angles of the second pins 24 located away from the second central axis 23s and inclined toward the second central axis 23s are greater than the inclined angles of the second pins 24 located close to the second central axis 23s and inclined toward the second central axis 23s. For instance, as shown in FIG. 3, the inclined angles of the pin 241, the pin 242, the pin 243, the pin 244, the pin 245, the pin 246, the pin 247 and the pin 248 inclined toward the second central axis 23s are $\theta21$, $\theta22$, $\theta23$, $\theta24$, $\theta25$, $\theta26$, $\theta27$ and $\theta28$, respectively, where $\theta21>\theta22>\theta23>\theta24$ and $\theta28>\theta27>\theta26>\theta25$. In addition, optionally, $\theta21=\theta28$, $\theta22=\theta27$, $\theta23=\theta26$ and $\theta24=\theta25$. The developing basis of the present embodiment is that substrate deformation causes a relatively large impact on the pins close to the outside and thus, it is easier to realize an alignment of the flexible substrate with the flexible circuit board by increasing the inclined angles of the pins close to the outside.

It is noted that the flexible circuit board 20 has a first end 20a and a second end 20b. After the flexible circuit board 20 and the flexible substrate 10 (referring to FIG. 2) are combined to form the flexible display panel shown in FIG. 1, the first end 20a is close to the display region 11 of the flexible substrate 10 and the second end 20b is away from the display region 11 of the flexible substrate 10.

Figure 7:
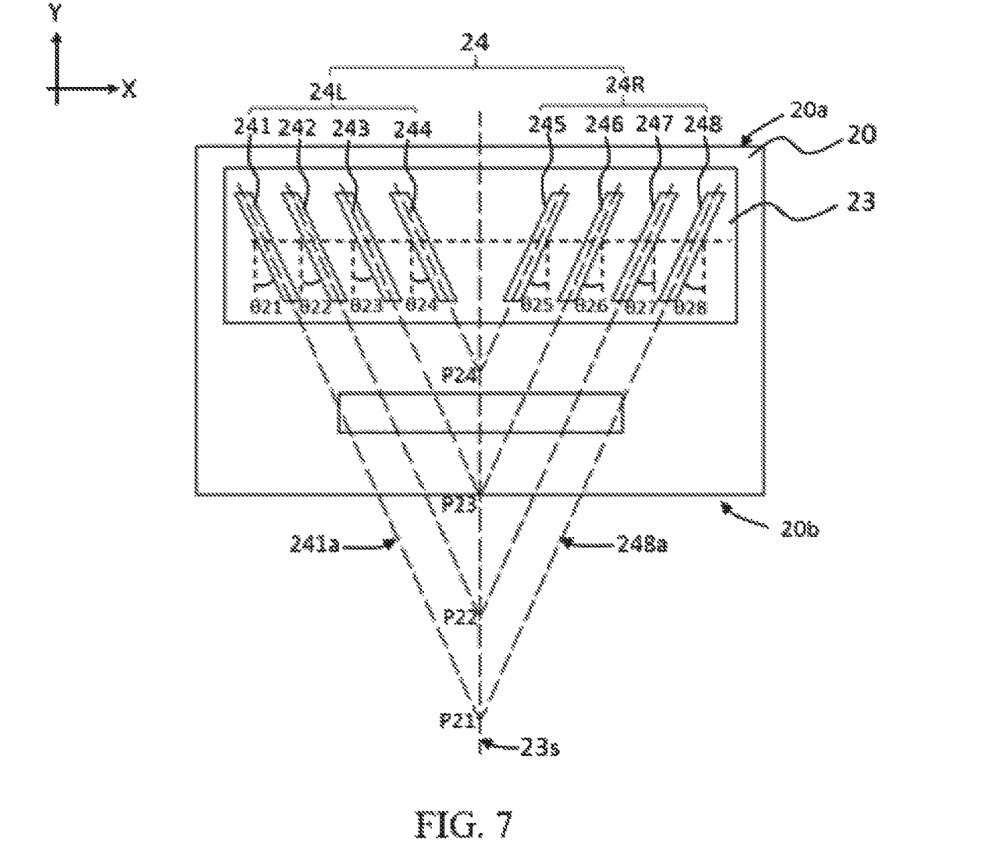
FIG. 7 is a structural schematic diagram showing a flexible circuit board provided in an embodiment of the present application, wherein the intersections of second pins 24 and a second central axis 23s are close to a second end 20b.

Optionally, the intersections of the second pins 24 and the second central axis 23s may be close to the first end 20a (as shown in FIG. 3) or may also be close to the second end 20b (as shown in FIG. 7). It is noted that "the intersections of the second pins 24 and the second central axis 23s are close to the first end 20a" described in the present application means that the second pins 24 intersect with the second central axis 23s only when extending along a direction toward the first end 20a, and conversely they do not intersect with each other. It is also noted that "the intersections of the second pins 24 and the second central axis 23s are close to the second end 20b" means that the second pins 24 intersect with the second central axis 23s only when extending along a direction toward the second end 20a, and conversely they do not intersect with each other. The embodiments of the present application provide two types of deployment of the second pins 24 as shown in FIGS. 3 and 7. It should be understood that the two types of deployment can achieve a same effect and can be chosen freely based on the structure and manufacturing processes of the display panel in practical applications.

Figure 5:
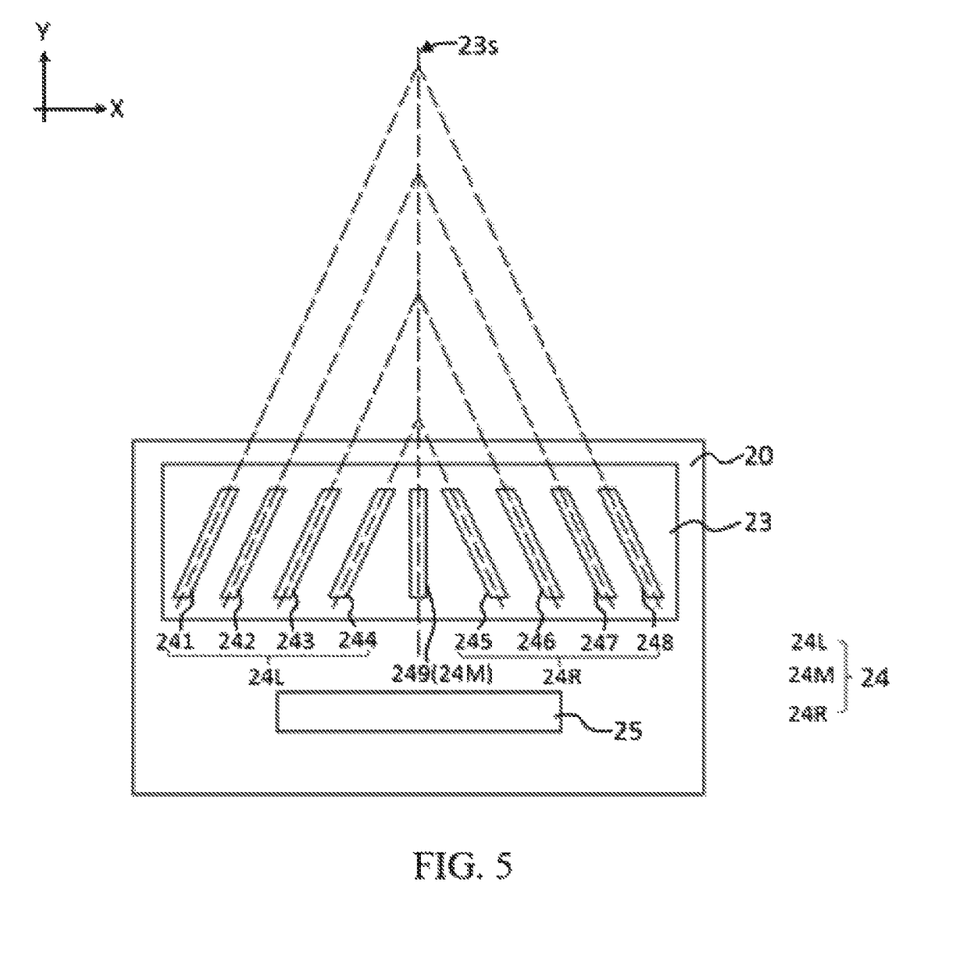
FIG. 5 is a structural schematic diagram showing a flexible circuit board provided in an embodiment of the present application, wherein a difference between the flexible circuit boards shown in FIGS. 3 and 5 is that the flexible circuit board shown in FIG. 5 includes a central pin area 24M.

Optionally, as shown in FIG. 5, the second pins 24 further include a central pin area 24M near the second central axis 23s. The pins in the central pin area 24M are parallel to the second central axis 23s. As shown in FIG. 5, the central pin area 24M includes a pin 249 which is parallel to the second central axis 23s. It is noted that the central pin area 24M may include one or more second pins 24, and the number of the second pins 24 included in the central pin area 24M is not limited in the present application. The developing basis of the present embodiment is that substrate deformation causes a relatively small impact on the pins at middle positions and thus, it can be ensured an accurate alignment of the flexible substrate with the flexible circuit board even though the pins at the middle positions are disposed to be parallel to the central axis.

It is noted that the flexible display panel provided in the embodiments of the present application includes the flexible substrate and the flexible circuit board that are provided in above embodiments, in which the pins of the flexible substrate and the pins of the flexible circuit board are connected to each other in one-to-one correspondence. Accordingly, in an aspect of deployment, a one-to-one relation exists between the pins of the flexible substrate and the pins of the flexible circuit board. The implementation of the flexible substrate and the implementation of the flexible circuit board are disclosed in above embodiments by illustrating them separately. However, it should be understood that by one-to-one corresponding connection, the pins of the flexible substrate and the pins of the flexible circuit board are combined to form the flexible display panel shown in FIG. 1. Accordingly, the flexible substrate and the flexible circuit board has the following relation but is not limited thereto—the inclined angles of the pins of the flexible circuit board are same when the inclined angles of the pins of the flexible substrate, and vice versa; the intersections of the pins of the flexible circuit board are close to the display region when the intersections of the pins of the flexible substrate are close to the display region, and vice versa; a part of the pins of the flexible circuit board are parallel to the central axis when a part of the pins of the flexible substrate are parallel to the central axis, and vice versa.

Figure 8A:
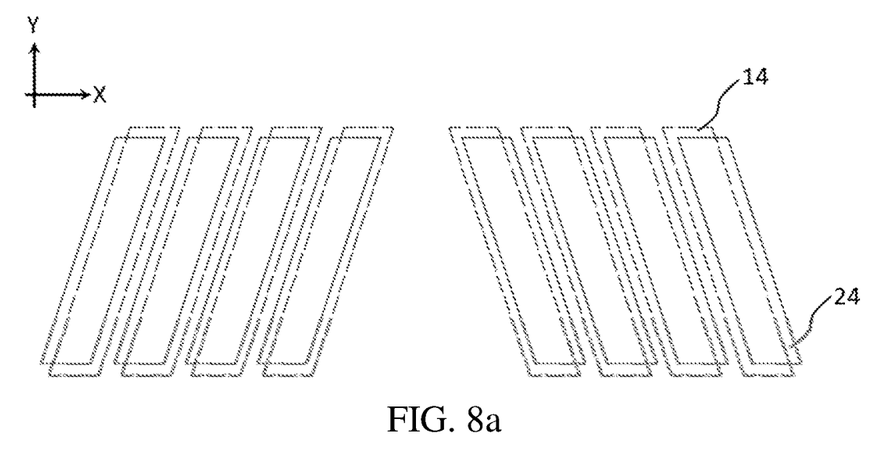
FIG. 8a is a schematic diagram showing a primary alignment of first pins 14 and second pins 24 provided in an embodiment of the present application.
Figure 8B:
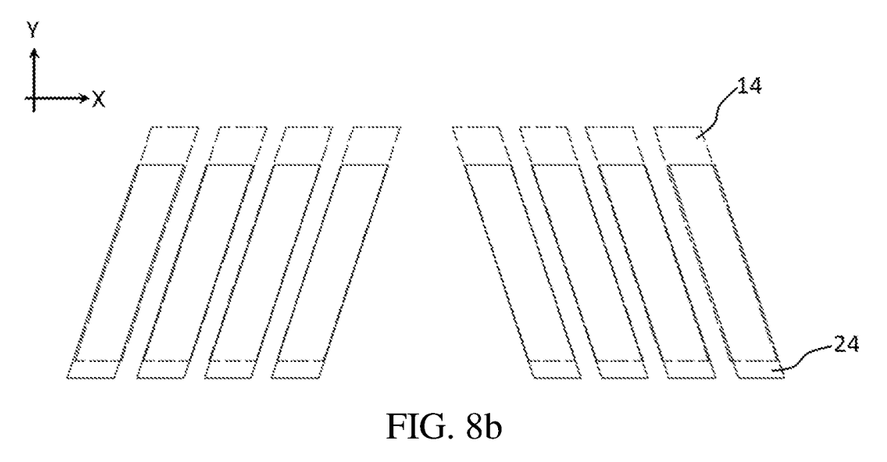
FIG. 8b is a schematic diagram showing an accurate alignment of the first pins 14 and the second pins 24 provided in an embodiment of the present application.

To clearly illustrate the processes of alignment and connection realized by the pins of the flexible substrate and the pins of the flexible circuit board that are provided in the embodiments of the present application, FIGS. 8a and 8b only illustrate the first pins 14 of the flexible substrate and the second pins 24 of the flexible circuit board and other structures on the flexible substrate and the flexible circuit board are omitted in these figures. FIG. 8a is a schematic diagram showing a primary alignment of the first pins 14 and the second pins 24. FIG. 8b is a schematic diagram showing an accurate alignment realized between the first pins 14 and the second pins 24. Before the alignment and connection, the second pins 24 may not be able to align with the first pins accurately (as shown in FIG. 8a) due to deformation (expansion or contraction) of the flexible circuit board. Meanwhile, an accurate alignment (as shown in FIG. 8b) of the first pins 14 and the second pins 24 can be realized as long as the whole second pins 24 are moved along a direction opposite to the second direction Y. Then, the first pins 14 and the second pins 24 are electrically connected to each other via a conductive adhesive.

Optionally, as shown in FIGS. 2 to 8b, the first pins 14 and the second pins 24 may be shaped as parallelograms or trapezoids, where the parallelogram refers to a quadrilateral having two sets of opposite parallel edges and the trapezoid refers to a quadrilateral having one set of opposite parallel edges.

The flexible display panel provided in the embodiments of the present application includes a flexible substrate and a flexible circuit board. Pins on the flexible substrate and the flexible circuit board are disposed to be inclined at a certain angle. When pitches of the pins on the flexible circuit board are changed due to expansion and contraction of the flexible circuit board itself, an accurate alignment of the pins on the flexible substrate and the flexible circuit board can be realized by adjusting the position of the flexible circuit board relative to the flexible substrate before connecting the flexible circuit board to the flexible substrate, thereby ensuring the quality of the flexible display panel and improving product yield in manufacturing processes of the display panel.

Above all, while the preferred embodiments of the present application have been illustrated and described in detail above, various modifications and alterations can be made by persons skilled in this art. The afore-described embodiment of the present application is therefore described in an illustrative but not restrictive sense. It is intended that the present application should not be limited to the particular forms as illustrated, and that all modifications and alterations which maintain the spirit and realm of the present application are within the scope as defined in the appended claims.

The invention claimed is:

1. A flexible display panel, comprising:
a flexible substrate, comprising a display region and a non-display region located at an external side of the display region, a first pin set disposed in the non-display region, the first pin set comprising a plurality of first pins disposed side by side along a first direction; and
a flexible circuit board, comprising a second pin set comprising a plurality of second pins disposed side by side along the first direction,
wherein the first pins and the second pins are electrically connected to each other,
wherein the first direction is perpendicular to a second direction, both of a first central axis of the first pin set and a second central axis of the second pin set are parallel to the second direction, at least a part of the first pins are inclined toward the first central axis and at least a part of the second pins are inclined toward the second central axis.

2. The flexible display panel according to claim 1, wherein the first pins are inclined toward the first central axis and the second pins are inclined toward the second central axis, and the first pins and the second pins are connected in one-to-one correspondence.

3. The flexible display panel according to claim 1, wherein the first pins are symmetric with respect to the first central axis, imaginary extending lines of the first pins at a left side of the first central axis and the imaginary extending lines of the first pins at a right side of the first central axis intersect at the first central axis two by two.

4. The flexible display panel according to claim 3, wherein the second pins are symmetric with respect to the second central axis, the imaginary extending lines of the second pins at the left side of the second central axis and the imaginary extending lines of the second pins at the right side of the second central axis intersect at the second central axis two by two.

5. The flexible display panel according to claim 4, wherein inclined angles of the first pins toward the first central axis are same and the inclined angles of the second pins toward the second central axis are same.

6. The flexible display panel according to claim 5, wherein the inclined angles of the first pins toward the first central axis are as the same as the inclined angles of the second pins toward the second central axis.

7. The flexible display panel according to claim 4, wherein inclined angles of the first pins located away from the first central axis and inclined toward the first central axis are greater than the inclined angles of the first pins located close to the first central axis and inclined toward the first central axis.

8. The flexible display panel according to claim 4, wherein inclined angles of the second pins located away from the second central axis and inclined toward the second central axis are greater than the inclined angles of the second pins located close to the second central axis and inclined toward the second central axis.

9. The flexible display panel according to claim 4, wherein intersections of the first pins and the first central axis are close to the display region.

10. The flexible display panel according to claim 9, wherein the intersections of the second pins and the second central axis are close to the display region.

11. The flexible display panel according to claim 4, wherein intersections of the first pins and the first central axis are away from the display region.

12. The flexible display panel according to claim 11, wherein the intersections of the second pins and the second central axis are away from the display region.

13. The flexible display panel according to claim 1, wherein the first pins located close to the first central axis are disposed parallel to the first central axis.

14. The flexible display panel according to claim 13, wherein a number of the first pins disposed parallel to the first central axis is no less than one.

15. The flexible display panel according to claim 1, wherein the second pins located close to the second central axis are disposed parallel to the second central axis.

16. The flexible display panel according to claim 15, wherein a number of the second pins disposed parallel to the second central axis is no less than one.

17. The flexible display panel according to claim 1, wherein the first pins and the second pins are connected to each other via a conductive film.

18. The flexible display panel according to claim 1, wherein the flexible circuit board comprises an integrated chip electrically connected to the second pins, and the integrated chip is configured to send control signals to the second pins.

19. The flexible display panel according to claim 1, wherein the first pins and the second pins are shaped as parallelograms or trapezoids.

* * * * *